United States Patent [19]
Friz et al.

[11] Patent Number: 5,340,607
[45] Date of Patent: Aug. 23, 1994

[54] VAPOR-DEPOSITION MATERIAL FOR THE PRODUCTION OF HIGH-REFRACTION OPTICAL COATINGS

[75] Inventors: Martin Friz, Muhltal; Detlef Albrecht, Griesheim, both of Fed. Rep. of Germany

[73] Assignee: Merck Patent Gesellschaft Mit Beschrankter Haftung, Darmstadt, Fed. Rep. of Germany

[21] Appl. No.: 35,103

[22] Filed: Mar. 19, 1993

[30] Foreign Application Priority Data

Mar. 19, 1992 [DE] Fed. Rep. of Germany ....... 4208811

[51] Int. Cl.$^5$ .................... C01F 17/00; C01G 23/00
[52] U.S. Cl. ................................. 427/162; 427/166; 427/248.1; 427/255; 427/566; 423/263; 423/598; 501/134
[58] Field of Search ............... 501/134; 423/263, 598; 427/162, 166, 248.1, 566, 255

[56] References Cited

U.S. PATENT DOCUMENTS

| | | | |
|---|---|---|---|
| 4,874,598 | 10/1989 | Oda et al. | 423/598 |
| 5,096,642 | 3/1992 | Shirasaki | 501/134 |

FOREIGN PATENT DOCUMENTS

| | | | |
|---|---|---|---|
| 1228489 | 11/1966 | Fed. Rep. of Germany . | |
| 54-001037 | 1/1979 | Japan | 423/598 |
| 61-247607 | 11/1986 | Japan | 501/134 |
| 295407 | 8/1977 | U.S.S.R. | 423/263 |

OTHER PUBLICATIONS

Ainger, F. W. et al, "Transparent $Pb_{1-x}La_x(HF_{1-y}Ti_y)O_3$ electrooptic ceramic" Journal of Materials Science No. 12, Aug. 1973 pp. 1825–1827.

Nanamatsu, S. et al "A New Ferroelectric:$(L_{22}Ti_2O_7)$", Ferroelectrics, vol. 8, No. ½, pp. 511–513, pt #1974.

*Primary Examiner*—Anthony Green
*Attorney, Agent, or Firm*—Millen, White, Zelano & Branigan

[57] ABSTRACT

The invention relates to a vapor-deposition material for the production of high-refraction optical coatings by coating substrates in vacuo. The material is a compound of the formula $La_2TiO_{7-x}$ where $x=$ from 0.3 to 0.7.

15 Claims, No Drawings

VAPOR-DEPOSITION MATERIAL FOR THE PRODUCTION OF HIGH-REFRACTION OPTICAL COATINGS

BACKGROUND OF THE INVENTION

Thin oxide coatings are widespread in industry, in particular in optics, as protective coatings or for optical function purposes. Thus, they can be used as protection against corrosion and mechanical damage or for coating the surfaces of optical components and instruments, such as, in particular, lenses, mirrors, prisms, etc. In addition, thin oxide coatings are used to produce high-, medium- and low-refraction optical coatings for increasing or reducing reflection. The main area of application is the production of antireflection coatings on spectacle lenses and on elements for camera lenses, binoculars and optical components for optical measuring instruments and for laser technology, furthermore for the production of coatings having a certain refractive index and/or certain optical absorption properties, for example in interference mirrors, beam dividers, heat filters and diathermic mirrors.

The starting materials for the production of these oxide coatings are known per se. Conventional materials are $SiO_2$ and a wide range of metal oxides, possibly in combination with one another. Selection is essentially empirical, depending on the desired optical properties and the processing properties. The coatings are produced by the vacuum vapor-deposition method, which is known per se. For an exemplary illustration, German Patent 12 28 489 is cited here, which indicates materials which can be used and processing methods and the problems which occur in this connection.

For the production of high-refraction coatings, i.e. coatings which have an optical refractive index of around 2, e.g., about 1.9 to about 2.4, preferably 2.0 to 2.2, the choice of starting materials which are suitable in principle is limited. Suitable starting materials are essentially the oxides of titanium, zirconium, hafnium and tantalum, and mixed systems thereof. The preferred starting material for high-refraction coatings is titanium dioxide.

However, these materials which are suitable per se have a number of disadvantages, which are evident, in particular, from practical processing.

One aspect here is that these substances have high melting and boiling points, which, in addition, are relatively close to one another. From a practical point of view, however, it is important that the vapor-deposition materials are in the fully-melted state before noticeable deposition begins. Only then is a uniform and adequate deposition rate ensured. This is necessary so that homogeneous and uniformly thick coatings form on the objects to be coated. In the case of the oxides of zirconium and hafnium and in the case of titanium/zirconium mixed oxide systems, however, this is not the case under practical application conditions. Said substances do not melt completely, or at all, under conventional working conditions. They are overall difficult to evaporate, and coatings having thickness variations are obtained.

It is therefore desired to reduce the melting points of the base materials by means of suitable additives. Additives furthermore serve to vary within certain limits and set in a specific manner the refractive index in the resultant coating.

The choice of suitable additives for this purpose is restricted by the requirement for freedom from absorption. The only metal oxides which are therefore suitable as corresponding additives are those which have no absorption in the visible spectral region and into the near UV wavelength range (up to about 320 nm).

A further problem is the following:

Although said oxides, as starting material, have only low absorption, or none at all, in the visible wavelength range, which is a prerequisite for the corresponding optical applications, the production of thin coatings by vacuum vapor deposition using these materials nevertheless results, without special precautions, in coatings of high absorption in the visible regions. This is particularly true of titanium dioxide, which is regarded as the starting material of choice for high-refraction coatings. This effect is attributed to loss of oxygen during high-vacuum vapour deposition and the deposition of titanium oxide coatings which are substoichiometric with respect to the oxygen content.

This problem can be circumvented by carrying out the vapor deposition under a vacuum with a certain oxygen residual pressure (about $10^{-4}$–$10^{-5}$ mbar), i.e. with an oxidizing character, and/or subjecting the resultant coatings to subsequent conditioning in oxygen or air. According to the abovementioned German Patent 12 28 489, this technique is particularly advantageous for adding elements or oxides from the rare earths to the materials to be evaporated.

Although the abovementioned problems can be solved by a suitable choice of additives or the selection of appropriate mixtures of materials, the use of mixed systems is not preferred per se in the vacuum vapor-deposition method. The reason is that mixed systems generally evaporate incongruently, i.e. they change their composition during the evaporation process and the composition of the deposited coatings also changes correspondingly. This can normally only be avoided if the mixed systems are discrete chemical compounds which evaporate without material change and can be recondensed.

SUMMARY OF THE INVENTION

An object of the invention is to provide a vapor-deposition material for the production of high-refraction optical for the production of high-refraction which does not have the disadvantages of the known materials and by means of which, in particular, uniform coatings which have a homogeneous composition and are absorption-free in the visible region can be produced.

Upon further study of the specification and appended claims, further objects and advantages of this invention will become apparent to those skilled in the art.

After consideration, a system based on the oxides of titanium and lanthanum, in particular the compound lanthanum titanate ($La_2Ti_2O_7$), appeared interesting in this respect.

Chemical Abstracts CA112(24):226980n cites a paper on the evaporation and condensation of lanthanide titanates in vacuo. Chemical Abstracts CA106(14):119159y cites the optical/physical properties of lanthanide titanates.

However, our own studies on the vacuum evaporation behavior of lanthanum/titanium came to the disappointing conclusion that this compound, like titanium dioxide itself and other titanium dioxide-containing mixed systems, has a particularly strong tendency toward spontaneous liberation of oxygen. This liberation of oxygen usually takes place with vigorous spitting, which makes the process difficult to carry out and means that useable coatings can only be obtained with difficulty. Due to the loss of oxygen, the resultant coatings are no longer stoichiometric with respect to the oxygen content. The consequent strong absorption in the visible region makes post-oxidation by conditioning in oxygen or air necessary.

Surprisingly, it has now been found that compounds of the formula $La_2Ti_2O_{7-x}$ where $x=$ from 0.3 to 0.7 are highly suitable as a vapor-deposition material for the production of high-refraction optical coatings by vacuum evaporation. It has been found that these materials can be evaporated in vacuo without problems and without spitting and give absorption-free coatings under the working conditions conventional in the vacuum evaporation method without further measures.

The invention thus relates to a vapor-deposition material for the production of high-refraction optical coatings by deposition on substrates in vacuo, the material being a compound of the formula $La_2Ti_2O_{7-x}$ where $x=$ from 0.3 to 0.7.

The invention furthermore relates to a process for the production of high-refraction optical coatings in which substrates are coated in vacuo with a vapor-deposition material of this type.

The vapor-deposition materials according to the invention contain, in the context of the above formula definition, a sub-stoichiometric amount of oxygen, compared with the base compound lanthanum titanate ($La_2Ti_2O_7$) which has a precisely stoichiometric composition. The intentional setting of the substoichiometric amount of oxygen in the materials according to the invention results, on the one hand, in no further liberation of oxygen resulting in undesired spitting of the molten material during the vacuum evaporation. On the other hand the selected range of the sub-stoichiometric amount of oxygen is such that absorption-free coatings form without further measures under the conventional working conditions in the vacuum evaporation method. It was also found that the optical properties of the resultant coatings are hardly affected by variations in the oxygen residual pressure during the vacuum evaporation. However, a greater sub-stoichiometric amount of oxygen than stated results in coatings which absorb in an undesired manner.

These findings are particularly surprising and were not foreseeable.

A particularly preferred vapor-deposition material is a compound which may be characterized by the formula $La_2Ti_2O_{6.5}$.

The vapor-deposition materials according to the invention can be obtained by mixing the oxides of lanthanum and titanium and, if desired, metallic titanium in the appropriate stoichiometric ratio and sintering the mixture in a high vacuum, e.g., about $10^{-3}$ to about $10^{-6}$ mbar, preferably $10^{-4}$ to $10^{-5}$ mbar, at below the melting point of each compound in the mixture. A preparation process of this type for the vapor-deposition materials according to the invention is likewise a subject-matter of the invention. The principal components of the starting material are lanthanum oxide ($La_2O_3$) and titanium dioxide ($TiO_2$); in order to set the desired sub-stoichiometric amount of oxygen, the oxides which are the sub-oxides of titanium, e.g., $Ti_2O_3$ and $TiO$, and/or metallic titanium can be used. The sintered product has a black appearance, melts fully at a temperature of about 1800° C. and can be evaporated at temperatures between 2200° and 2300° C. in a vacuum of about $10^{-4}$ mbar.

The vapor-deposition material according to the invention can be employed in the vacuum vapor-deposition apparatuses and equipment which are conventional in the relevant technology in a known manner and under the processing conditions which are customary for this purpose, e.g. see H. A. Macleod, "Thin-Film Optical Filters", Adam Hilger Ltd., Bristol, 2nd Ed., 1986, Chapter 9: Production Methods and Thin-Film Materials; and German Patent No. 12 28 489. The vacuum evaporation can be carried out not only by thermal evaporation, but also by electron-beam evaporation.

The deposition can be conducted, e.g., at $O_2$ residual pressure of about $4 \times 10^{-4}$ to about $8 \times 10^{-5}$, preferably $10^{-4}$ to $2 \times 10^{-4}$ mbar.

Using the material according to the invention, homogeneous, thin coatings of uniform thickness which have strong adhesion and are particularly resistant to mechanical and chemical effects can be produced on any suitable substrates. The coatings have high refraction; their refractive index is around 2.0, depending on the composition and measurement wavelength. The coatings have high transmission in a wavelength range from near UV (from about 360 nm) through the visible region to the near IR (about 7000 nm) and are particularly free from absorption in the visible wavelength region.

The vapor-deposition material according to the invention can particularly advantageously be employed for the coating of substrates which cannot be warmed or can only be warmed slightly, for example up to about 80° C. Heat-sensitive substrates of this type include plastics and cemented glass optics. These require vapor-deposition materials which give durable, high-adhesion and absorption-free homogeneous coatings even without heating the substrate.

When known substances, for example tantalum oxide, titanium oxide, zirconium oxide and mixtures, for example of praseodymium oxide and titanium oxide, are used for the coating of unheated substrates, problems arise due to absorption or inhomogeneity of the coatings.

Surprisingly, the material according to the invention gives absorption-free, homogeneous coatings, even in the case of unheated substrates.

Without further elaboration, it is believed that one skilled in the art can, using the preceding description, utilize the present invention to its fullest extent. The preferred specific embodiments are, therefore, to be construed as merely illustrative, and not limitative of the disclosure in any way whatsoever.

The entire disclosure of all applications, patents and publications, cited above and below, and of corresponding German No. P 42 08 811.9, are hereby incorporated by reference.

EXAMPLE 1

Preparation

A powder mixture is prepared from 68.2% by weight of lanthanum (III) oxide, $La_2O_3$
29.3% by weight of titanium (IV) oxide, $TiO_2$
2.5% by weight of titanium (Metallic), Ti and the mixture is granulated. The composition is selected so that a compound of the formula $La_2Ti_2O_{6.5}$ forms, i.e., by combining the oxides and metallic titanium in the amounts which produce the desired La:Ti:O molar ratio of the end product.

The granules are sintered 5 hours at a temperature of 1800° C. in a high vacuum ($10^{-4}$ mbar). The black product obtained has a density of 5.9 g/cm$^3$ and a melting point of 1800° C.

EXAMPLE 2

Use

The granules from Example 1 are introduced into an evaporation crucible made of molybdenum and inserted into a commercially available vacuum vapor-deposition apparatus with electron-beam evaporation.

The substrate to be coated comprises quartz.

The coating is carried out at a temperature from 2200° to 2300° C. and an O$_2$ residual pressure of $2 \times 10^{-4}$ mbar at a substrate temperature of 250° C. and a deposition rate of 0.4 nm/sec until a coating thickness of 250 nm has been reached.

The coating has a refractive index n of 2.12 at 500 nm. The coating exhibits no absorption in the visible region and up to a wavelength of 375 nm.

EXAMPLE 3

Coating of plastic substrates

The granules from Example 1 are introduced into an evaporation crucible made of molybdenum and introduced into a vacuum evaporation apparatus with electron-beam evaporation.

The substrate to be coated comprises plastic (polycarbonate).

The coating is carried out at a temperature of from 2200° to 2300° C. and an O$_2$ residual pressure of $2 \times 10^{-4}$ mbar at a deposition rate of 0.4 nm/sec onto unheated substrates until a coating thickness of about 250 nm has been reached.

The coating has a refractive index of about 1.98 (unwarmed) or 2.02 (warming to about 50° C.) at 500 nm. The coating is homogeneous and exhibits no absorption to wavelengths of 390 nm.

The preceding examples can be repeated with similar success by substituting the generically or specifically described reactants and/or operating conditions of this invention for those used in the preceding examples.

From the foregoing description, on skilled in the art can easily ascertain the essential characteristics of this invention, and without departing from the spirit and scope thereof, can make various changes and modification of the invention to adapt it to various usages and conditions.

What is claimed is:

1. A production of compound of the formula La$_2$Ti$_2$O$_{7-x}$, wherein x=0.3–0.7.

2. A compound of claim 1, wherein x is 0.5.

3. A process for the preparation of a vapor deposition material comprising a compound of the formula La$_2$Ti$_2$O$_{7-x}$, wherein x is 0.3–0.7, comprising:
   combining an amount of a lanthanum oxide and an amount of a titanium oxide to obtain a combination of oxides, wherein said combination has a La:Ti:O ratio of 2:2:7-x, wherein x is 0.3–0.7; and
   sintering said combination of oxides under vacuum at a temperature which is below the melting point of the oxides and metallic titanium.

4. A process of claim 3, wherein x=0.5 and a compound of the formula La$_2$Ti$_2$O$_{6.5}$ is recovered after sintering.

5. A process of claim 3, wherein said lanthanum oxide is La$_2$O$_3$ and said titanium oxide is TiO$_2$.

6. A process of claim 5, further comprising combining Ti$_2$O$_3$ or TiO with said La$_2$O$_3$ and TiO$_2$ to form said combination of oxides.

7. A process of claim 3, wherein the vacuum is $10^{-3}$ to $10^{-6}$ mbar.

8. A process of claim 3, wherein the vacuum is $10^{-4}$ to $10^{-6}$ mbar.

9. A process according to claim 3, wherein metallic titanium is combined with said lanthanum oxide and said titanium oxide to form said combination of oxides.

10. A process for the production of a substrate with a high-refraction optical coating, comprising coating said substrate with a compound of the formula La$_2$Ti$_2$O$_{7-x}$, wherein x is 0.3–0.7, by vapor deposition.

11. A process of claim 10, wherein the coating is accomplished by electron-beam evaporation.

12. A process of claim 10, wherein the refractive index of the high-refraction optical coating is 1.9–2.4.

13. A process of claim 10, wherein the refractive index of the high-refraction optical coating is 2.0–2.2.

14. A process for the production of a substrate with a high-refraction optical coating, comprising coating said substrate with a compound of the formula La$_2$Ti$_2$O$_{6.5}$ by vapor deposition.

15. In a process for the production of a substrate with a high-refraction optical coating by vapor deposition of said substrate in a vacuum, the improvement comprising coating said substrate with a compound of the formula La$_2$Ti$_2$O$_{7-x}$, wherein x is 0.3–0.7, by vapor deposition.

* * * * *